United States Patent
Mört et al.

(10) Patent No.: US 6,649,424 B2
(45) Date of Patent: Nov. 18, 2003

(54) METHOD FOR FABRICATING AN INTEGRATED SEMICONDUCTOR CIRCUIT HAVING A STRONGLY POLARIZABLE DIELECTRIC OR FERROELECTRIC

(75) Inventors: Manfred Mört, München (DE); Walter Hartner, Glen Allen, VA (US); Volker Weinrich, Paris (FR); Günther Schindler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/154,340

(22) Filed: May 23, 2002

(65) Prior Publication Data

US 2002/0197743 A1 Dec. 26, 2002

(30) Foreign Application Priority Data

May 23, 2001 (DE) .......................................... 101 25 370

(51) Int. Cl.$^7$ .......................... H01L 21/00; H01G 71/02
(52) U.S. Cl. ...................... 438/3; 257/295; 361/321.1; 365/65; 374/177
(58) Field of Search ................. 365/65, 145; 381/173; 374/177; 349/100; 361/320, 321, 322; 257/295; 438/3

(56) References Cited

U.S. PATENT DOCUMENTS 3,609,482 A * 9/1971 Edelman et al. ............ 317/258
3,720,862 A * 3/1973 Mason ....................... 317/258
6,548,342 B1 * 4/2003 Suzuki et al. ............... 438/240

FOREIGN PATENT DOCUMENTS

EP    0 380 326 B1    8/1990

* cited by examiner

*Primary Examiner*—Caridad Everhart
*Assistant Examiner*—Calvin Lee
(74) *Attorney, Agent, or Firm*—Laurence A. Greenberg; Werner H. Stemer; Ralph E. Locher

(57) ABSTRACT

A method of fabricating semiconductor circuits having integrated capacitors that have a dielectric or a ferroelectric material between electrodes. The materials are subjected to heat treatment at high temperatures in an oxygen atmosphere for the purpose of crystallization. The dielectric or ferroelectric is heated separately from the semiconductor substrate, is comminuted into small particles and only afterward applied in this form to the semiconductor substrate. This makes it possible to integrate substances with arbitrarily high crystallization temperature without damaging the integrated semiconductor circuit, since the semiconductor substrate itself does not have to be heated. Diffusion barriers for oxygen are unnecessary. Previous limitations on the capacitor capacitance are obviated owing to the free choice of dielectric or ferroelectric made possible, and the packing density of the capacitors is increased.

17 Claims, 3 Drawing Sheets

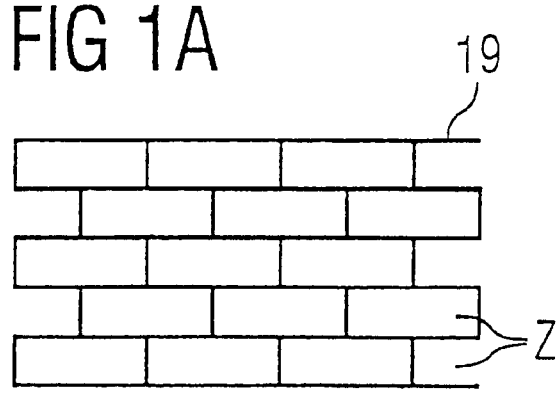
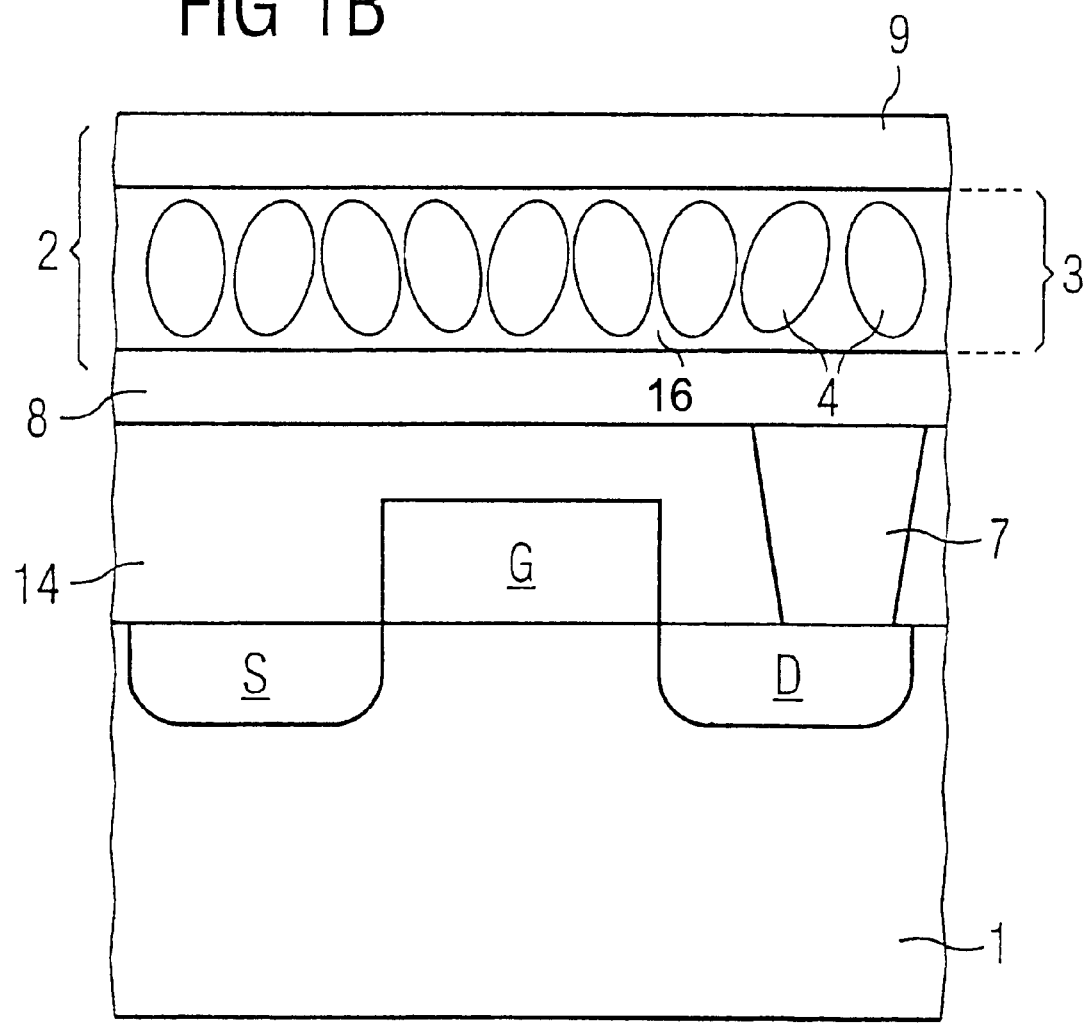

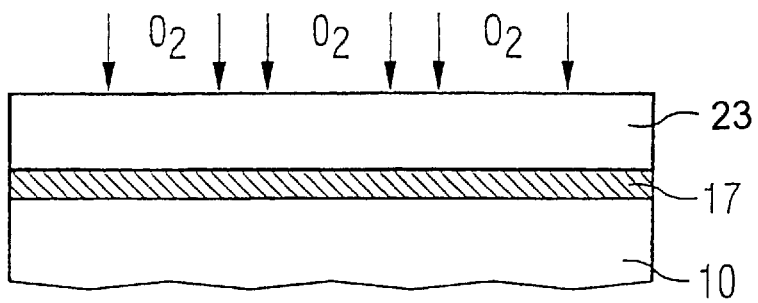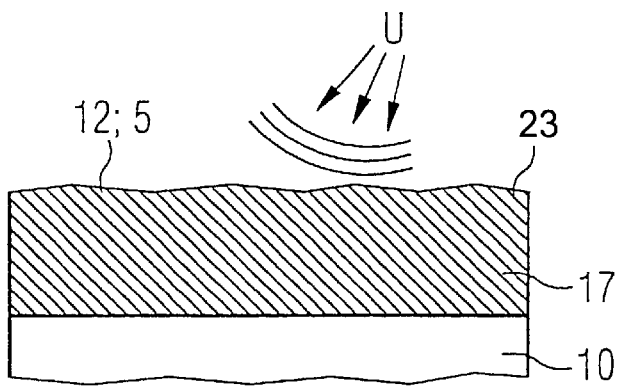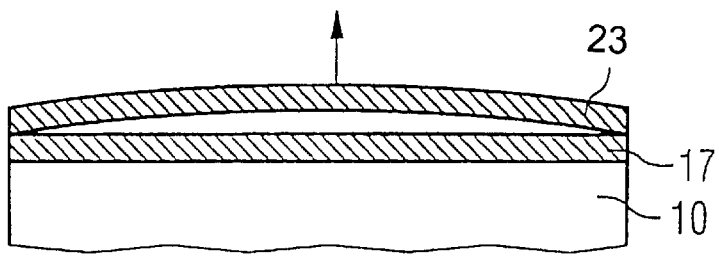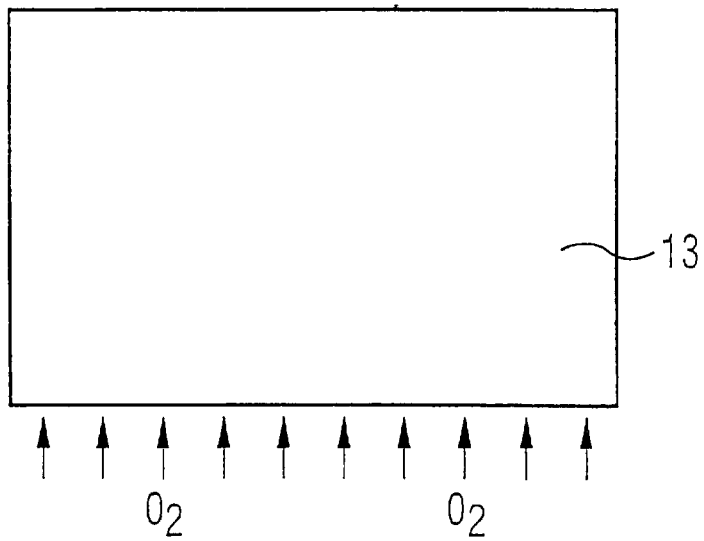

ized semiconductor circuit. The circuit has an integrated capacitor with a first electrode, a second electrode and an electrically insulating dielectric or ferroelectric disposed between the first electrode and the second electrode. The capacitor is formed on a semiconductor substrate, and the dielectric or ferroelectric is heated and thereby converted into a strongly polarizable phase.

METHOD FOR FABRICATING AN INTEGRATED SEMICONDUCTOR CIRCUIT HAVING A STRONGLY POLARIZABLE DIELECTRIC OR FERROELECTRIC

BACKGROUND OF THE INVENTION

FIELD OF THE INVENTION

The invention relates to a method for fabricating an integrated semiconductor circuit. The circuit has an integrated capacitor with a first electrode, a second electrode and an electrically insulating dielectric or ferroelectric disposed between the first electrode and the second electrode. The capacitor is formed on a semiconductor substrate, and the dielectric or ferroelectric is heated and thereby converted into a strongly polarizable phase.

Such methods are used for fabricating semiconductor circuits having integrated capacitors, in particular memory circuits. The capacitors contain either a dielectric having a high dielectric constant or a ferroelectric as a strongly polarizable medium disposed between the electrodes.

Strongly dielectric materials having a dielectric constant $\epsilon > 100$, preferably in a range from 200 to 300, are used in order to produce high-capacitance capacitors in the smallest possible space.

Ferroelectrics, in contrast, on account of their remanent polarization, are used for fabricating nonvolatile memories.

The ferroelectric and dielectric properties of the capacitor materials used are known. In contrast, incorporating the materials into integrated semiconductor circuits poses difficulties.

The ferroelectrics or dielectrics—usually substances with a perovskite structure (such as e.g. oxides of many alloys)—are usually not formed until a material that has initially been deposited in amorphous form onto a semiconductor substrate is heated to a temperature of 550–800° C., usually above 700° C., because the strongly polarizable ferroelectric or dielectric phase forms only above this temperature.

During the fabrication of integrated semiconductor circuits, a first electrode is applied to the semiconductor substrate. At this point in time, the transistors are already fabricated and are provided with contact connections, so-called plugs, at least below the first electrodes of the capacitors. The contacts produce the electrical connection between the transistor and the capacitor.

After the deposition of the metal layer intended for the production of the bottom electrode of all the capacitors to be formed, the dielectric is applied to the semiconductor substrate and subsequently heated. The dielectric and ferroelectric materials require a heat treatment of up to an hour for the conversion into the strongly polarizable phase. The entire semiconductor substrate is exposed to the crystallization temperature over this long period of time, as a result of which undesired changes to structures already fabricated can arise.

The heat treatment is carried out in an oxygen-containing atmosphere, preferably in a pure oxygen atmosphere. The oxygen supplied supports the oxidation and thus promotes the formation of the ferroelectric or strongly dielectric crystal lattice. During the heat treatment, oxygen can diffuse within the semiconductor substrate.

In order that the semiconductor structures situated below the first electrode, which is usually composed of platinum and is therefore inert with respect to oxygen, are not attacked and oxidized by diffusing oxygen, below the first electrode a thin layer is provided as an oxygen barrier, which is intended to prevent the further diffusion into deeper regions of the semiconductor circuit. As a result, the plugs that are situated between the first electrode and an underlying transistor and produce the electrical connection are intended to be protected against oxidation.

However, at the crystallization temperatures of usually above 700° C. that are necessary for perovskite and are required for the conversion into the strongly polarizable phase, the oxygen barrier is no longer able to stop diffusing oxygen. Above this temperature, titanium nitride and tungsten nitride, for example, oxidize and thus become nonconducting and pervious to oxygen. Below this temperature, too, oxygen cannot be completely stopped, the barrier effect becoming stronger, the lower the crystallization temperature employed.

In order to protect the integrated semiconductor circuit as well as possible from oxidation during the heat treatment, the temperature for the crystallization of the dielectric or ferroelectric is therefore lowered. Although this advantageously reduces the diffusion of oxygen into the integrated semiconductor circuit, it nonetheless leads to a large loss of remanent polarization in the dielectric or ferroelectric. The conversion into the ferroelectric phase does not commence at all below a minimum temperature—which is about 650° C. for example for strontium bismuth tantalate.

In the case of dielectrics, a heat treatment to an insufficient extent leads to a lower dielectric constant of the dielectric. As a consequence thereof, capacitors cannot store the envisaged charge or have to be made larger than is actually necessary.

Thus, the reduction of the oxygen diffusion is obtained at the expense of a loss of remanent polarization or a loss of storage density attained.

Other efforts are directed toward finding such barrier materials that are particularly stable at high temperatures, i.e. which do not oxidize or become pervious even at the desired crystallization temperature. However, barrier materials having the desired properties are still not known.

SUMMARY OF THE INVENTION

It is accordingly an object of the invention to provide a method for fabricating an integrated semiconductor circuit having a strongly polarizable dielectric or ferroelectric that overcomes the above-mentioned disadvantages of the prior art methods of this general type, which, during the heating of the dielectric or ferroelectric reliably prevents diffusion of oxygen into the integrated semiconductor circuit without losing part of the remanent polarization in the ferroelectric.

With the foregoing and other objects in view there is provided, in accordance with the invention, a method for fabricating an integrated semiconductor circuit. The method includes providing a semiconductor substrate and forming an integrated capacitor on the semiconductor substrate. The integrated capacitor has a first electrode, a second electrode, and an electrically insulating layer disposed between the first electrode and the second electrode. The step of forming the integrated capacitor includes depositing an electrically insulating material being either a dielectric or a ferrroelectric, on an intermediate carrier. The intermediate carrier with the electrically insulating material is heated for converting the electrically insulating material into a strongly polarizable phase. The electrically insulating material is detached from the intermediate carrier. The electrically insulating material is comminuted into particles and the particles are applied to the semiconductor substrate for forming the electrically insulating layer of the integrated capacitor.

In the case of the method mentioned in the introduction, the object is achieved by virtue of the fact that the dielectric or ferroelectric material is deposited on an intermediate carrier and is heated on the intermediate carrier, is detached again from the intermediate carrier, and is comminuted into small particles and applied in the form of the particles to the semiconductor substrate.

The invention is based on a partial deviation from the fundamental layer concept which provides a deposition always of whole layers and, if appropriate, the patterning thereof on the semiconductor substrate. According to the invention, the dielectric or ferroelectric material is not deposited as a layer on the semiconductor substrate, but rather is first provided separately in amorphous form and heated principally separately from the semiconductor substrate, i.e. preferably individually, to the required crystallization temperature. In the process, the dielectric or ferroelectric is converted into the strongly polarizable phase but does not yet have the configuration required for application to the semiconductor substrate. Therefore, after heating, the dielectric or ferroelectric material is comminuted into many small particles and applied in this form to the semiconductor substrate.

The procedure obviates the need for the semiconductor substrate and the semiconductor circuit that has already partly been produced on it to be subjected to heat treatment together with the dielectric or ferroelectric, as a result of which the risk of oxidation of the semiconductor circuit does not occur. Moreover, the barrier layer for oxygen can be entirely obviated unless diffusing oxygen has to be intercepted elsewhere within the context of the further fabrication of the semiconductor circuit. As a result, the present invention makes it possible to use, as dielectrics or ferroelectrics, capacitor media which are subjected to heat treatment at unreduced elevated crystallization temperature and therefore have the greatest possible remanent polarization or the greatest possible dielectric constant. Furthermore, the risk of oxidation of the semiconductor structures, in particular of contacts below the first electrode, is averted; the search for suitable and better barrier materials is superfluous.

According to the invention, the dielectric or ferroelectric is deposited on an intermediate carrier, is detached again from the intermediate carrier and then applied to the semiconductor substrate. In this case, the dielectric or ferroelectric is preferably deposited on the intermediate carrier in the same way as conventionally on the substrate with the integrated semiconductor circuit.

The dielectric or ferroelectric is heated on the intermediate carrier, i.e. separately from the semiconductor substrate. Consequently, instead of the temperature-sensitive semiconductor circuit, the intermediate carrier can be heated to the required crystallization temperature in order to convert the dielectric or ferroelectric into the strongly polarizable phase, i.e. into a ferroelectric or a strong dielectric. Afterward, the crystalline dielectric or ferroelectric is detached again from the intermediate carrier and, after the comminution into small particles, is applied to the semiconductor substrate.

In principle, no limits are imposed on the choice of material for the intermediate carrier; it must only withstand the required crystallization temperature and is not permitted to react chemically with the dielectric or ferroelectric too much.

Furthermore, the dielectric or ferroelectric must be able to be removed again from the intermediate carrier after the heating and, if appropriate, cooling without an excessively high outlay. Preferred embodiments therefore provide for the dielectric or ferroelectric to be detached from the intermediate carrier with the aid of ultrasound, chemically or with the aid of stresses generated mechanically and/or thermally. Ultrasound is suitable for destabilizing the dielectric or ferroelectric materials at the interface between the deposited layer of dielectric or ferroelectric and the underlying intermediate carrier and for removing the dielectric or ferroelectric in whole portions. On the other hand, chemical stripping by weak acids, solvents or cleaning agents is also possible. Finally, it is possible to utilize strains between the intermediate carrier and the layer of dielectric or ferroelectric above it in order to separate the dielectric or ferroelectric. In particular, thermal stresses arising as a result of the cooling operation can be utilized and, if appropriate, mechanically reinforced, which leads to the layer of dielectric or ferroelectric clipping or flaking off from the intermediate carrier. For better separation of the dielectric or ferroelectric from the intermediate carrier, the methods mentioned can also be combined with one another, in particular in order to accelerate the stripping with the aid of chemical substances.

For better removal of the dielectric or ferroelectric from the intermediate carrier, a particularly preferred embodiment provides for a substrate provided with an adhesion-reducing covering layer to be used as the intermediate carrier. By virtue of the adhesion-reducing covering layer on the intermediate carrier, which functions as an intermediate layer after the deposition of the dielectric or ferroelectric, the adhesion of the dielectric or ferroelectric on the intermediate carrier can be reduced and the selection of appropriate basic materials for the intermediate carrier can be significantly widened. In conjunction with the assistance of the stripping operation by a chemical, thermal-mechanical or acoustic procedure, the dielectric or ferroelectric can easily be stripped from the intermediate carrier.

It is preferably provided that the semiconductor substrate is used as the intermediate carrier. The growth of layers to be deposited on semiconductor substrates—if appropriate on an intermediate layer—has been well researched in semiconductor technology. Moreover, comparatively few semiconductor substrates can be used as an intermediate carrier in order to subject the dielectric or ferroelectric to heat treatment and to isolate it free of residues of unknown origin.

An alternative embodiment of the present invention provides for the dielectric or ferroelectric to be heated as raw composition. Since, according to the invention, the separately heated dielectric or ferroelectric is comminuted into small particles, the form in which the dielectric or ferroelectric is heated is unimportant. The heat treatment as raw composition has the advantage that a large amount of capacitor material can be crystallized simultaneously. In a similar manner to sintering, the crystallization operation can lead to changes in the external form of the dielectric or ferroelectric, but this is unimportant owing to the subsequent comminution into fine microparticles. Equally, it is possible to obtain the dielectric or ferroelectric in a sol gel process. In this case, organic compounds of the metals required are mixed in a solution, whereupon the mixture is gelled and the atoms and molecules are spatially fixed. Heating above the decomposition temperature of the organic materials leads to the formation of many small oxide particles and, with the further supply of heat, to the formation of ferroelectric or strongly dielectric crystallites. Furthermore, the initially loose microstructure of the oxide particles is densified by the heat treatment. However, the particles are separated from one another again and comminuted by the subsequent comminution.

Methods for comminuting the dielectric or ferroelectric are known per se. Thus, it is conceivable that, after a coarse comminution the dielectric or ferroelectric is comminuted further in a ball mill in order to obtain microscopic particles having a typical particle diameter of a few dozen nanometers. In this form, the dielectric or ferroelectric is particularly well prepared for the application to the integrated semiconductor circuit.

With regard to the application of the particles to the semiconductor substrate, a preferred embodiment provides for the particles to be applied to the substrate in a suspension. In the suspension, a suitable liquid surrounds the particles of the dielectric or ferroelectric and thus enables application in the same way as in the case of a resist mask. At the same time, the powder of oxidic or other capacitor material becomes better able to be handled.

In particular, it is provided that the suspension is spin-coated onto the semiconductor substrate. In the spin-on technique, a drop of a substance to be applied or, as in this case, of the suspension is applied in the center of a rotating semiconductor substrate, as a result of which the substance or the suspension is distributed by the centrifugal force over the entire surface of the semiconductor substrate. The desired layer thickness is set by the speed of rotation. The layer thickness can additionally be controlled by the viscosity of the liquid used.

As an alternative to this, it is provided that the suspension is applied to the semiconductor substrate according to the Langmuir-Blodgett method. The method is cited for example in the reference by Roempp, titled "Chemie-Lexikon" under "Langmuir-Blodgett films". The method is originally employed for depositing monomolecular, amphiphilic or amphotropic molecular layers as densely as possible on a surface. Amphiphilic molecules with a, for example, hydrophilic, i.e. water-attracting, head region and a hydrophobic, i.e. water-repellent, organic molecular chain are thus deposited with a laterally high density onto a surface, for example a substrate. The Langmuir-Blodgett method includes dipping the substrate into a container with the amphiphilic or amphotropic solution, reducing the surface area of the liquid by an approach of side walls of the liquid container and thus increasing the density of the molecules on the surface of the liquid. In this case, a substrate is made to emerge very slowly from the liquid, the molecules at the surface of the liquid being deposited in a very densely compact manner on the substrate.

If the semiconductor substrate is withdrawn from such a liquid in the same way, the microparticles of the dielectric or ferroelectric which are enclosed by the amphiphilic or amphotropic molecules are deposited in high density onto the carrier, thereby achieving a particularly high packing density of the particles of the dielectric or ferroelectric on the first electrode.

As soon as the suspension of the particles has been applied to the semiconductor substrate, the dielectric or ferroelectric can be subjected to further processing steps like a normal layer.

By way of example, it is provided that electric dipoles are induced and oriented in the particles of the dielectric or ferroelectric on the semiconductor substrate. To that end, an electric field is applied whose direction prescribes the desired direction of the electric dipoles. In this case, the electric field runs perpendicularly to the substrate surface and thus perpendicularly to the area of the first capacitor electrode.

The orientation of the dipoles can furthermore be supported by the semiconductor substrate being surrounded by plasma. The electrically conductive plasma carries the applied potential difference right up to the top side and underside of the semiconductor substrate and thus makes it possible to increase the electric field strength prevailing in the semiconductor substrate for the purpose of orienting the dipoles. The high-frequency electric AC field used to generate the plasma at the same time promotes the orientation of the electric dipoles in the direction of the temporally constant field component. The electrodes of the plasma chamber into which the semiconductor substrate is brought for the purpose of dipole orientation can at the same time generate, in addition to the electric AC field component, the electric DC field component in the chamber volume.

It is preferably provided that a liquid surrounding the particles of the dielectric or ferroelectric in the suspension is evaporated. If the liquid is readily volatile, the evaporation need not be thermally assisted. In any event, however, the evaporation temperature is far below that temperature which is required for the conversion of the dielectric or ferroelectric into the strongly polarizable phase.

A further embodiment provides for interspaces between the particles of the dielectric or ferroelectric on the semiconductor substrate to be filled with an insulator. The insulator prevents the approach or even a short circuit of the first electrode and the second electrode that is subsequently to be deposited in regions of the capacitor in which there are few or even no particles of the crystalline dielectric or ferroelectric present.

A perovskite is preferably used as the dielectric or ferroelectric. A multiplicity of perovskites including layer perovskites are known. Principally, oxides of metal alloys often have a perovskite structure. With regard to the present invention, the term perovskite is to be understood in the broadest possible sense.

Two embodiments relating to the selection of the perovskite material provide for the dielectric or ferroelectric, in its strongly polarizable phase, to be a ferroelectric or a dielectric having a dielectric constant $\epsilon > 100$. By way of example, strontium bismuth tantalate or lead zirconate titanate can be used in the first case, and barium strontium titanate in the second case.

The method according to the invention can be used for fabricating any desired semiconductor circuits. However, the application of the method described for fabricating an integrated semiconductor memory is preferred. In this case, storage capacitors are required in large numbers and in a high packing density, for which purpose a high remanent polarization or a high dielectric constant of the dielectric or ferroelectric is advantageous.

Other features which are considered as characteristic for the invention are set forth in the appended claims.

Although the invention is illustrated and described herein as embodied in a method for fabricating an integrated semiconductor circuit having a strongly polarizable dielectric or ferroelectric, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic illustration of an integrated semiconductor memory having a multiplicity of cells according to the invention;

FIG. 1B is a diagrammatic sectional view perpendicularly through a substrate surface of a cell shown in FIG. 1A;

FIGS. 2A–2C are sectional views showing steps for forming an electrically insulating material;

FIG. 2D is an illustration of a heating step for forming the electrically insulating material;

DESCRIPTION OF THE PREFERRED EMBODIMENTS

Figure 2E:
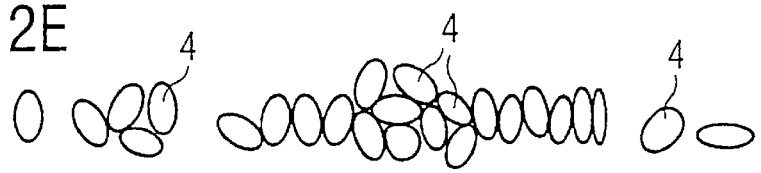
FIG. 2E is an illustration of the electrical insulating material.

Referring now to the figures of the drawing in detail and first, particularly, to FIG. 1A thereof, there is shown an integrated semiconductor memory 19 having a multiplicity of cells Z. In FIG. 1B, there is shown partially one of the cells Z. The cell Z contains above a semiconductor substrate 1, a transistor having a gate G, a source region S and a drain region D. A capacitor 2 is situated above the transistor, in a manner isolated by an oxide layer 14. The capacitor 2 has a dielectric or ferroelectric material 3 between a first, bottom electrode 8 and a second, top electrode 9. The dielectric or ferroelectric material 3 is present in the form of small crystallite particles 4 having a size of, preferably, from 30 to 50 nm and is embedded in a filler 16 which prevents a short circuit in the capacitor between the crystallite particles 4. The capacitor 2 is accordingly fabricated according to the method according to the invention which is described below with reference to FIGS. 2A to 2I. According to the method, the dielectric or ferroelectric material 3 outside the semiconductor substrate 1 is converted into the strongly polarizable phase, so that a heat treatment of the entire substrate 1 is not necessary. Therefore, the semiconductor circuit existing below the capacitor 2 is not damaged by diffusing oxygen. In particular, an oxide barrier is no longer required above a contact 7, which connects the drain region D of the transistor to the first electrode 8.

The construction of the semiconductor circuit illustrated in FIG. 1B is simplified and merely diagrammatic. However, it illustrates the stacked capacitor configuration in which the capacitors are disposed above the transistors in order to achieve a particularly high packing density. Conventionally, the offset configuration is in some instances preferred, in which the capacitors are disposed laterally with respect to the transistors on the surface of the semiconductor substrate 1. This leads to a drastic reduction of the packing density but is often accepted in order to prevent the conventionally unavoidable oxidation of the semiconductor circuit by oxygen diffusing during the heat treatment. In contrast, according to the invention, the stacked capacitor configuration illustrated can be realized without consideration of the magnitude of the crystallization temperature of the perovskite 4.

The method according to the invention is illustrated below with reference to FIGS. 2A to 2I.

In accordance with FIG. 2A, a capacitor material 23 is deposited on an intermediate carrier 10. The intermediate carrier 10 is preferably covered with an adhesion-reducing covering layer 17, which is intended to facilitate the later stripping of the layer of the capacitor material 23 from the intermediate carrier 10. At this point in time, the capacitor material 23 is deposited as a homogeneous, amorphous layer on the intermediate carrier 10. In this form, it can be heated together with the intermediate carrier 10 to the required crystallization temperature. The latter is approximately 600–800° C. in the case of a perovskite as the capacitor material 23. At this temperature, if the perovskite 23 had been deposited on the semiconductor substrate 1 itself, the oxygen supplied during the heat treatment would inevitably lead to more or less significant damage to the semiconductor circuit. On the intermediate carrier 10, however, possible oxidation of the carrier material 10 does not have any consequences.

FIG. 2B illustrates how the dielectric or ferroelectric 23 is detached from the intermediate carrier 10, 17 with the aid of a chemical substance 12 or 5 in conjunction with ultrasound U. During the stripping process, the dielectric or ferroelectric 23 disintegrates into small fragments. The chemical substance 12 may be, in particular, a liquid 5 which is applied together with the dielectric or ferroelectric particles 23 as a suspension to the semiconductor substrate 1, as illustrated in FIG. 2F.

In FIG. 2B, weak acids or cleaning agents such as e.g. acetone are appropriate for the stripping of the dielectric or ferroelectric 23.

FIG. 2C illustrates the detachment of the layer 23 with the aid of strains brought about mechanically and/or thermally between the intermediate carrier 10 and the layer 23 of the dielectric or ferroelectric. The latter is detached for example during the cooling operation, after the heat treatment, by lateral stresses in a large-area manner from the intermediate carrier 10 or the adhesion-reducing layer 17 situated thereon. If appropriate, ultrasound or chemicals may additionally accelerate the stripping.

The forming and heat treatment of the dielectric or ferroelectric 23 on the intermediate carrier 10, as illustrated in FIGS. 2A to 2C, leads to readily comminutable fragments of the dielectric or ferroelectric 23. This has the advantage that the particles 23 only have to be comminuted briefly in a ball mill in order to obtain the microcrystalline particles 4, which are even significantly smaller.

Figure 2F:
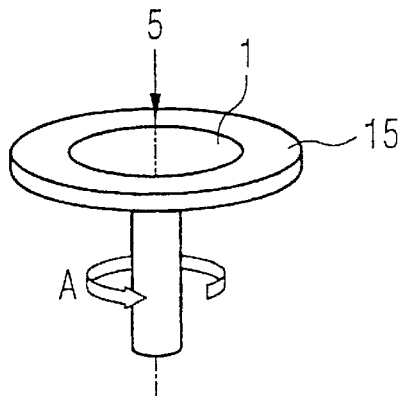
FIG. 2F is a perspective view of how the electrical insulating material is applied to a substrate.

If the duration of the comminution operation is unimportant or very large quantities of the dielectric or ferroelectric are required simultaneously, the latter can, as illustrated in FIG. 2D, also be subjected to heat treatment as a raw composition 13 in an oxygen atmosphere and be converted into the ferroelectric or strongly dielectric phase. In this case, the raw composition 13 is first coarsely comminuted and subsequently ground to form even smaller microparticles 4 in the same way, as illustrated in FIG. 2E.

The microparticles 4 are deposited in the form of a suspension 5 onto the semiconductor substrate 1, more precisely onto the bottom, first electrode of all the capacitors.

FIG. 2F illustrates the deposition operation according to the spin-on method, in which the suspension 5 is applied to the substrate 1 on a substrate plate 15, which rotates at high speed in a direction of an arrow A about its center axis. In this case, depending on its viscosity and according to the speed of rotation of the substrate 1, the suspension 5 is distributed up to a predetermined thickness, which typically lies between 60 and 200 nm. The suspension 5 is thus ready for further processing on the semiconductor substrate 1. This is illustrated in FIGS. 2G, 2H and 2I.

Figure 2G:
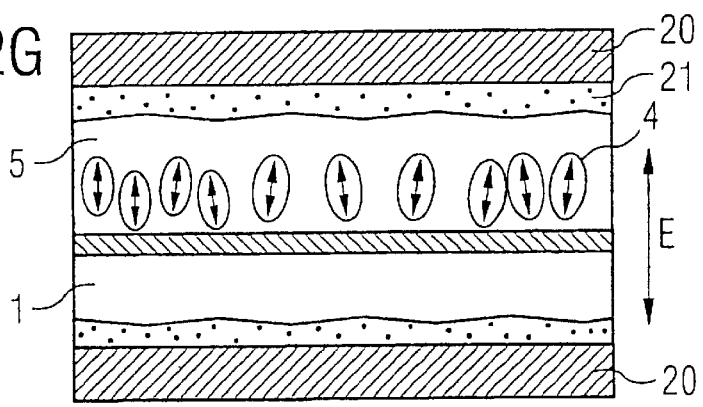
FIGS. 2G–2I are sectional views of further process steps for forming an integrated semiconductor circuit incorporating the electrical insulating material.

According to FIG. 2G, the semiconductor substrate 1 with the suspension 5, which contains the microcrystalline particles 4 and a liquid 6 surrounding the latter, can be brought into a plasma chamber with two electrodes 20 and plasma 21 generated between the electrodes 20. In it, the electric dipoles of the crystallites are oriented by an electric field E between the electrodes 20 perpendicularly to the substrate surface. The plasma 21 serves for bringing the electrical potentials present at the electrodes 20 right up to the top side and underside of the semiconductor substrate 1, as a result of which the effective electrode spacing is reduced and the electric field strength is increased. This is important since the thickness of the suspension 5, which thickness is illustrated with its size exaggerated in FIG. 2G and amounts to a few hundred nanometers, is orders of magnitude smaller than the thickness of the semiconductor substrate 1, so that the potential difference acting on the suspension 5 is significantly smaller anyway than the voltage applied to the electrodes 20. Bringing the voltage up to the substrate by the plasma at least partly compensates for this effect.

The orientation of the electric dipoles can be achieved by an electric AC field, a unidirectional electric field or by a superposition of both fields.

Figure 2H:
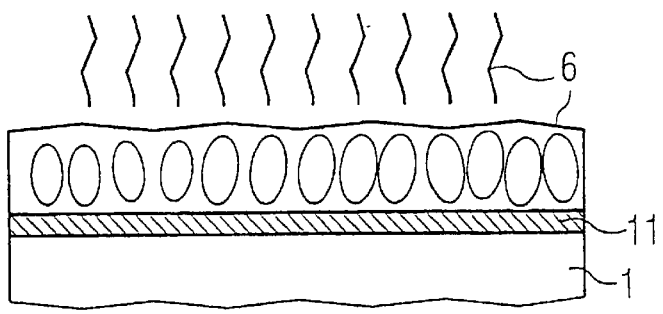
Figure 2I:
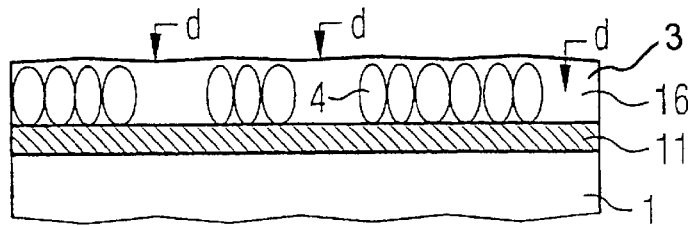

FIG. 2H illustrates how the liquid 6 contained in the suspension 5 is removed from the semiconductor substrate 1 by evaporation, after which only the particles 4 of the dielectric or ferroelectric remain. The evaporation of the liquid 6 can be accelerated by an increase in temperature to 50 to 400° C.—depending on the volatility of the liquid. In any event, however, the increase in temperature is significantly lower than that which is required for the capacitor material to undergo transition into the strongly polarizable phase and, in conventional methods, leads to damage to the semiconductor circuit by diffusing oxygen.

FIG. 2I illustrates how gaps d between the particles 4 of the dielectric or ferroelectric are filled by the filler or insulator 16, thereby producing a planar layer on which the second electrode can be applied at a uniform distance from the first electrode. The first electrode is not specifically illustrated in FIGS. 2G, 2H and 2I. However, it is situated directly below a layer 11, which can be provided as an additional adhesion layer below the layer with the particles 4 of the dielectric or ferroelectric. The adhesion layer 11 affords an additional possibility for influencing the adhesion of the microparticles 4 in a manner dependent on the material of the bottom electrode. Thus, it is possible to increase the adhesion on the semiconductor substrate 1 by an additional layer in a similar manner to the reduction of the adhesion by the adhesion-reducing layer 17 on the intermediate carrier 10 in FIGS. 2A, 2B and 2C.

Finally, the second electrode is applied to the structure illustrated in FIG. 2I and is patterned together with the first electrode and the intervening dielectric or ferroelectric, thereby forming a multiplicity of capacitors in a known manner. The insulator 16 which surrounds the microparticles 4 of the dielectric or ferroelectric material 3 in FIG. 2I is preferably a spin-on glass or a polymer. In addition to the spin-on method illustrated in FIG. 2F, chemical vapor deposition is suitable for the application of the insulator.

The dielectric or ferroelectric material 3 is preferably subjected to chemical mechanical polishing in order to remove insulator material that is situated above the crystallites 4 and does not contribute to the strong polarizability of the dielectric or ferroelectric.

In the manner described, it is possible to produce any desired semiconductor circuits with capacitors in the stacked capacitor configuration, without electrical contacts to capacitors that are situated below the capacitor being damaged. Since, according to the invention, the heat treatment and hence crystallization of the dielectric or ferroelectric material 3 is effected separately from the semiconductor substrate 1, no oxygen can diffuse into the substrate. Consequently, substances, in particular perovskite, having an arbitrary elevated crystallization temperature can be used as dielectric or ferroelectric between the electrodes without dispensing with the stacked capacitor configuration. Moreover, a diffusion barrier below the capacitor is superfluous.

The invention is suitable for the fabrication of integrated semiconductor memories of any type. Ferromagnetic memories and those having a strong dielectric are preferably fabricated.

We claim:

1. A method for fabricating an integrated semiconductor circuit, which comprises the steps of:
   providing a semiconductor substrate;
   forming an integrated capacitor on the semiconductor substrate, the integrated capacitor having a first electrode, a second electrode, and an electrically insulating layer disposed between the first electrode and the second electrode, the step of forming the integrated capacitor further comprises:
   depositing an electrically insulating material, selected from the group consisting of a dielectric and a ferrroelectric, on an intermediate carrier;
   heating the intermediate carrier with the electrically insulating material for converting the electrically insulating material into a strongly polarizable phase;
   detaching the electrically insulating material from the intermediate carrier;
   comminuting the electrically insulating material into particles; and
   applying the particles to the semiconductor substrate for forming the electrically insulating layer of the integrated capacitor.

2. The method according to claim 1, which comprises during the detaching step using ultra sound for assisting in separating the electrically insulating material from the intermediate carrier.

3. The method according to claim 1, which comprises during the detaching step, chemically detaching the electrically insulating material from the intermediate carrier chemically.

4. The method according to claim 1, which comprises during the detaching step, using at least one of mechanically generated stresses and thermally generated stresses for assisting in detaching the electrically insulating material from the intermediate carrier.

5. The method according to claim 1, which comprises using the substrate provided with an adhesion-reducing covering layer as the intermediate carrier.

6. The method according to claim 1, which comprises using the semiconductor substrate as the intermediate carrier.

7. The method according to claim 1, which comprises applying the particles to the semiconductor substrate in a suspension.

8. The method according to claim 7, which comprises spin-coating the suspension onto the semiconductor substrate.

9. The method according claim 7, which comprises applying the suspension to the semiconductor substrate according to a Langmuir-Blodgett method.

10. The method according to claim 1, which comprises inducing and orienting electric dipoles in the particles on the semiconductor substrate.

11. The method according to claim 10, which comprises inducing and orienting the electrical dipoles using an electric field.

12. The method according to claim 11, which comprises surrounding the semiconductor substrate with plasma for inducing and orienting the electric dipoles.

13. The method according to claim 7, which comprises evaporating a liquid surrounding the particles in the suspension.

14. The method according to claim 1, which comprises filling interspaces between the particles on the semiconductor substrate with an insulator.

15. The method according to claim 1, which comprises using a perovskite as the electrically insulating material.

16. The method according to claim 1, which comprises using the ferroelectric as the electrically insulating material.

17. The method according to claim 1, which comprises using the dielectric having a dielectric constant $\epsilon>100$ as the electrically insulating material.

* * * * *